United States Patent [19]
Takebuchi

[11] Patent Number: 6,018,195
[45] Date of Patent: Jan. 25, 2000

[54] MOS GATE STRUCTURE SEMICONDUCTOR DEVICE

[75] Inventor: Masataka Takebuchi, Yokosuka, Japan

[73] Assignee: Kabushiki Kaisha Toshiba, Kawasaki, Japan

[21] Appl. No.: 08/834,863

[22] Filed: Apr. 10, 1997

[30] Foreign Application Priority Data

Apr. 11, 1996 [JP] Japan .................................. 8-089584

[51] Int. Cl.⁷ .............................. H01L 23/48; H01L 29/40
[52] U.S. Cl. ........................ 257/752; 257/751; 257/763; 257/767; 257/770; 438/631
[58] Field of Search .................................... 257/315, 752, 257/751, 763, 767, 770; 438/626, 631

[56] References Cited

U.S. PATENT DOCUMENTS

| | | | |
|---|---|---|---|
| 4,566,940 | 1/1986 | Itsumi et al. | 438/296 |
| 4,980,738 | 12/1990 | Welch et al. | 257/588 |
| 5,257,095 | 10/1993 | Liu et al. | 257/315 |
| 5,268,590 | 12/1993 | Pfiester et al. | 257/764 |
| 5,374,849 | 12/1994 | Tada | 257/751 |
| 5,616,959 | 4/1997 | Jeng | 257/758 |
| 5,717,251 | 2/1998 | Hayashi et al. | 257/758 |
| 5,834,845 | 11/1998 | Stolmeijer | 257/752 |
| 5,907,787 | 5/1999 | Sato | 438/622 |

*Primary Examiner*—Jerome Jackson, Jr.
*Assistant Examiner*—George C. Eckert, II
*Attorney, Agent, or Firm*—Banner & Witcoff, Ltd.

[57] ABSTRACT

A high-speed and highly-integrated semiconductor device and a producing method thereof, which can reduce resistance between a gate electrode and a wiring layer on the gate electrode and can make an element minute, are provided. The gate electrodes on a semiconductor substrate, diffusion layers formed in a surface region of the semiconductor substrate, buried electrodes formed on the semiconductor substrate so as to be connected to the diffusion layers respectively, an interlayer insulating film buried in spaces between the gate electrodes and in spaces between the gate electrodes and the buried electrodes, and wiring layers formed so as to be connected to the gate electrodes or to the buried electrodes are provided. A height of surfaces of the gate electrodes, a height of surfaces of the buried electrodes and a height of a surface of the interlayer insulating film are equal, and the surfaces of the gate electrodes, the buried electrodes and the interlayer insulating film form a plane. The wiring layers formed on the plane so as to be directly connected to the surfaces of the gate electrodes and the buried electrodes.

2 Claims, 9 Drawing Sheets

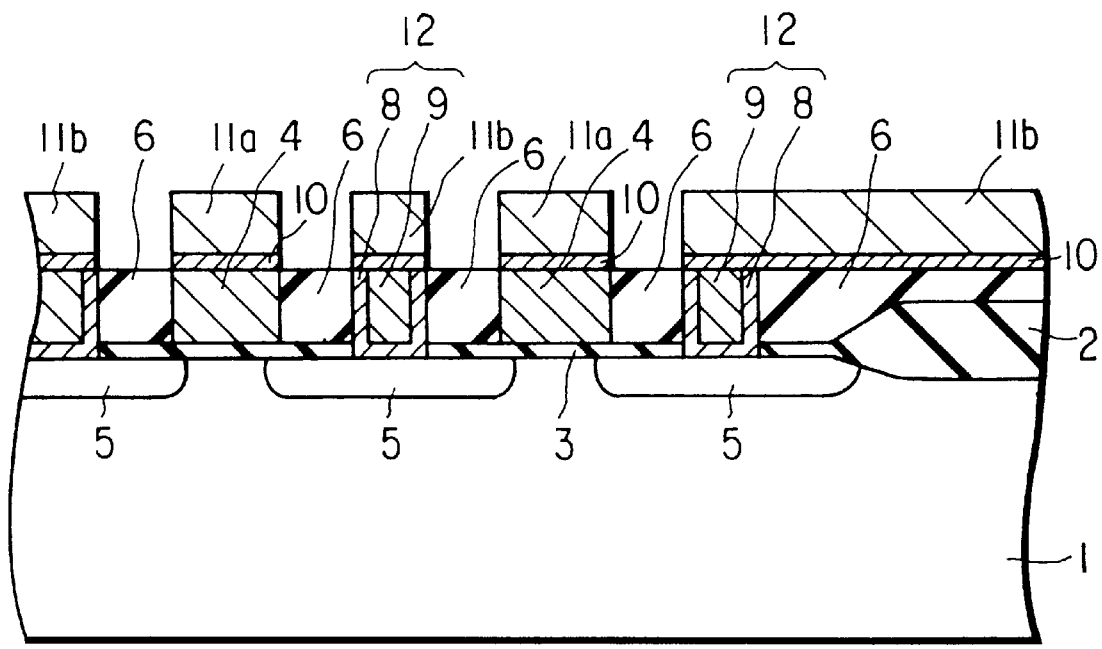
F I G. 1
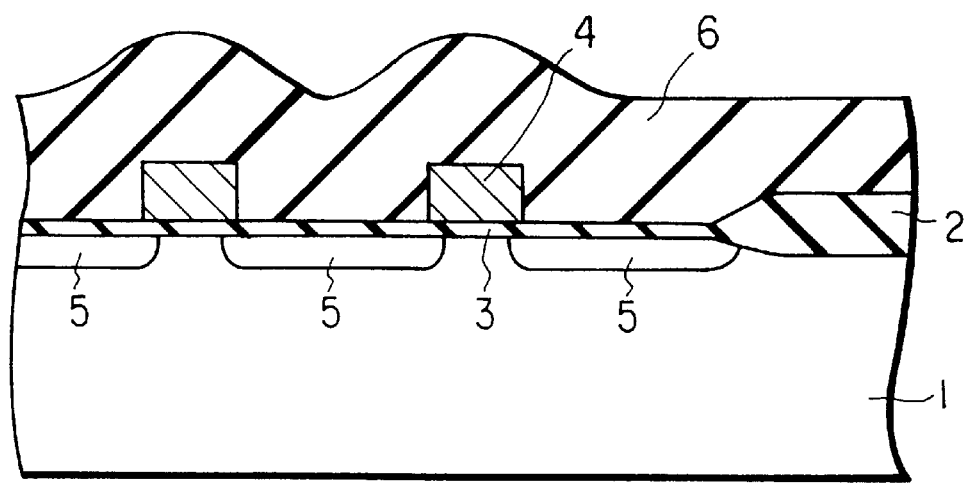
F I G. 2

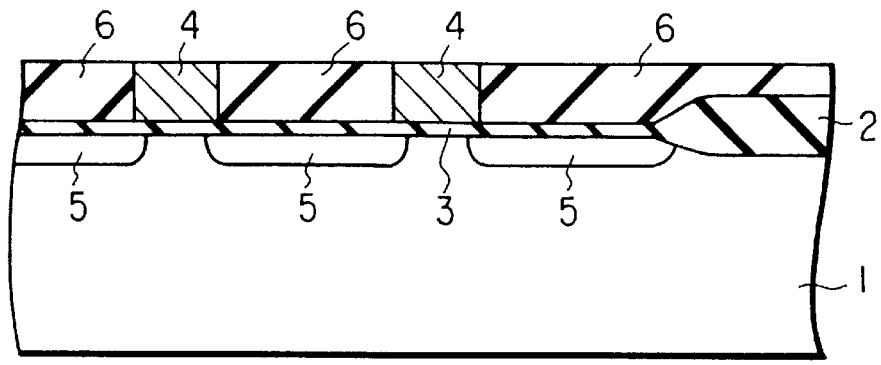
F I G. 3
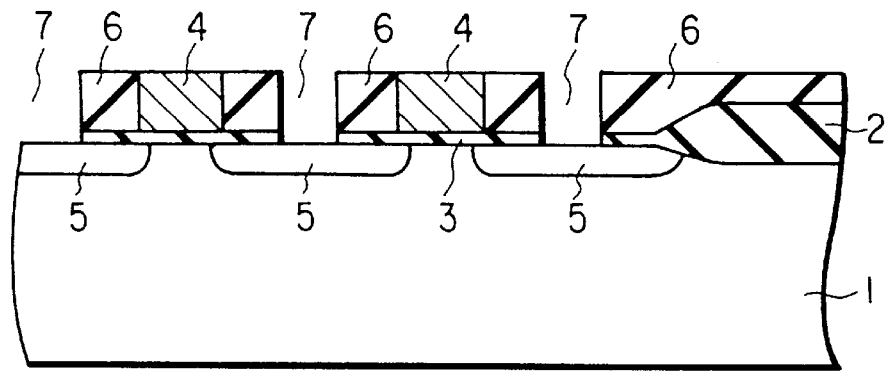
F I G. 4
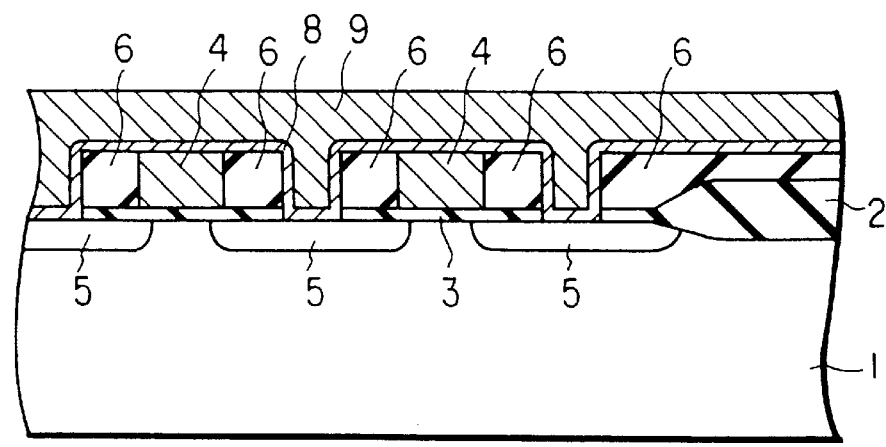
F I G. 5

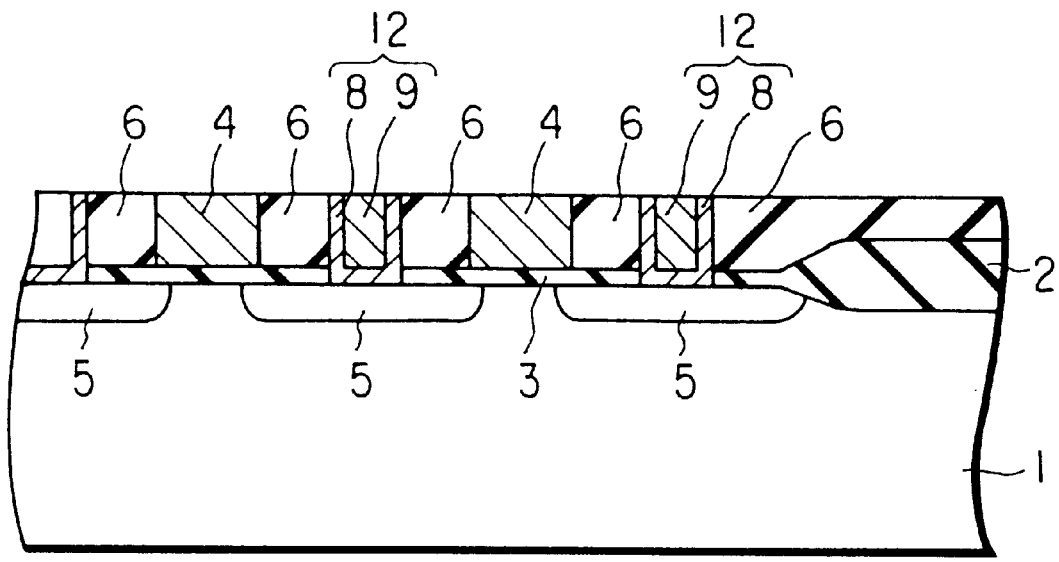
F I G. 6
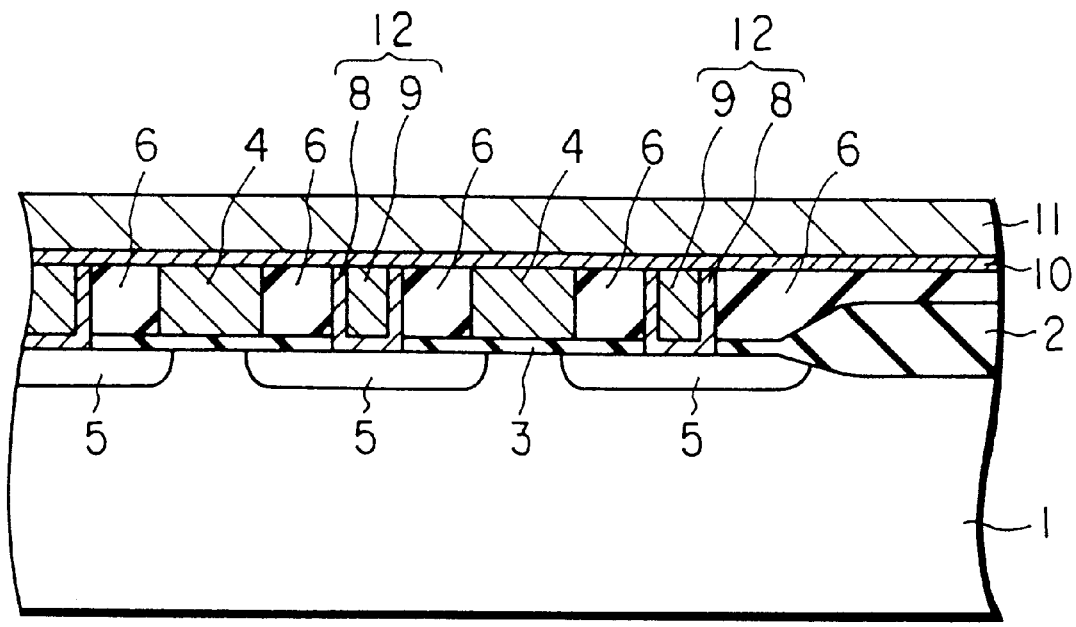
F I G. 7

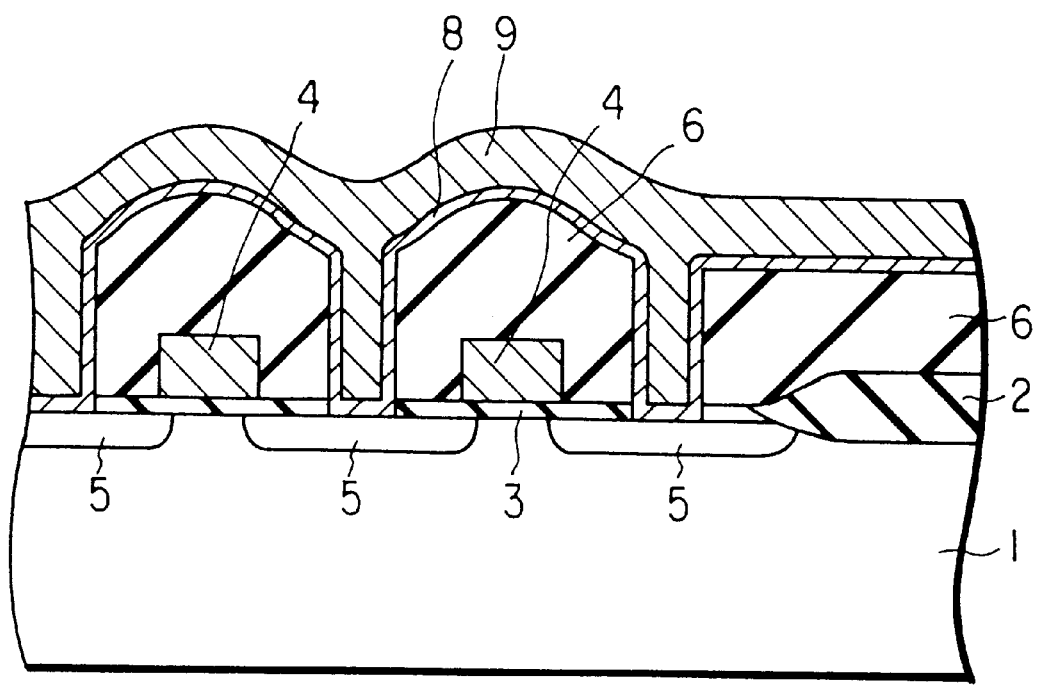
F I G. 10
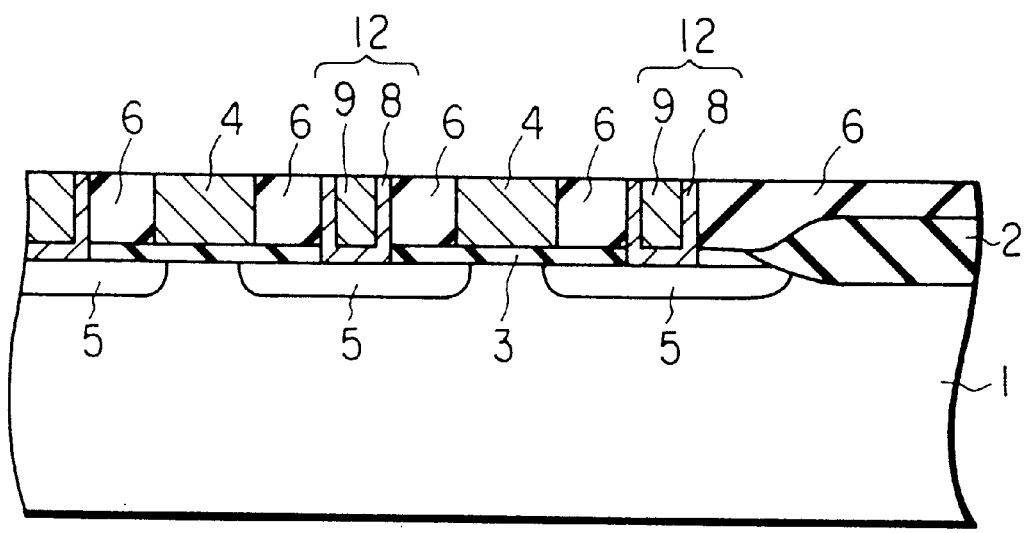
F I G. 11

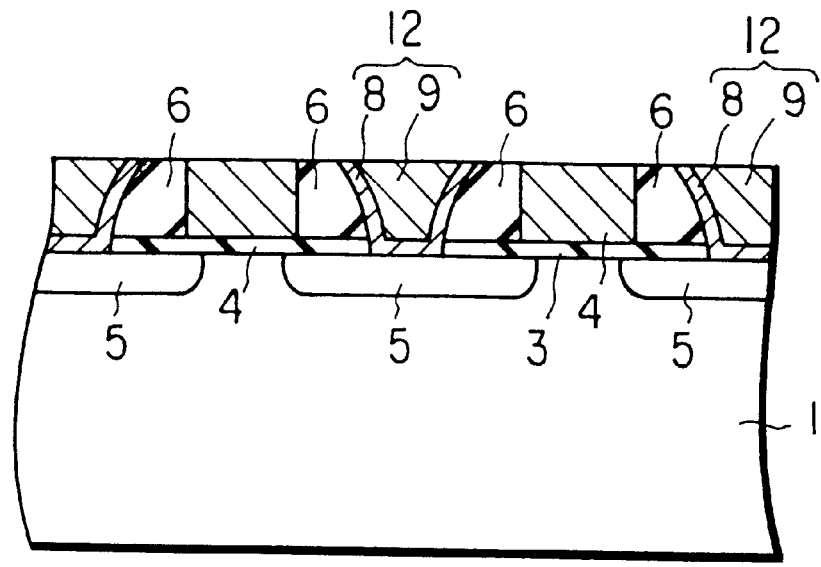
F I G. 15
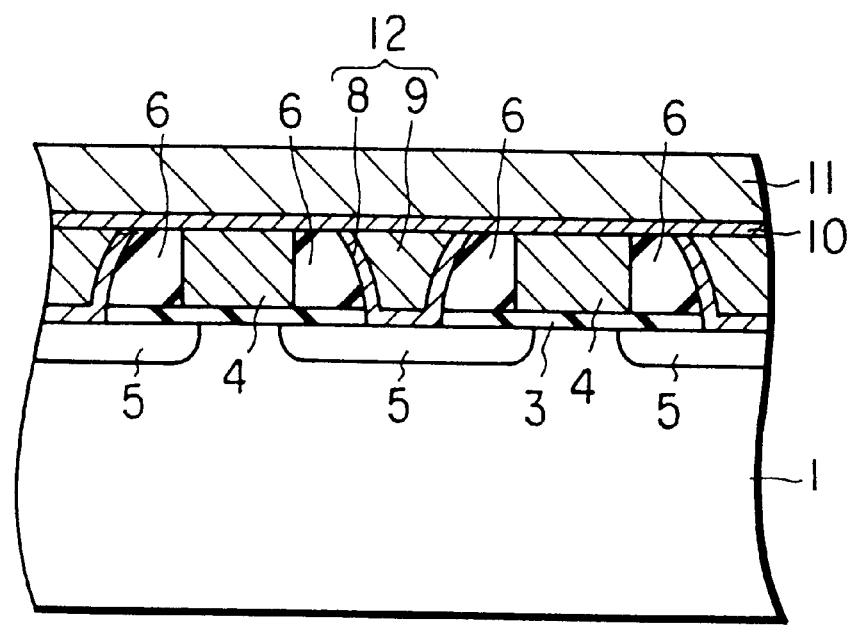
F I G. 16

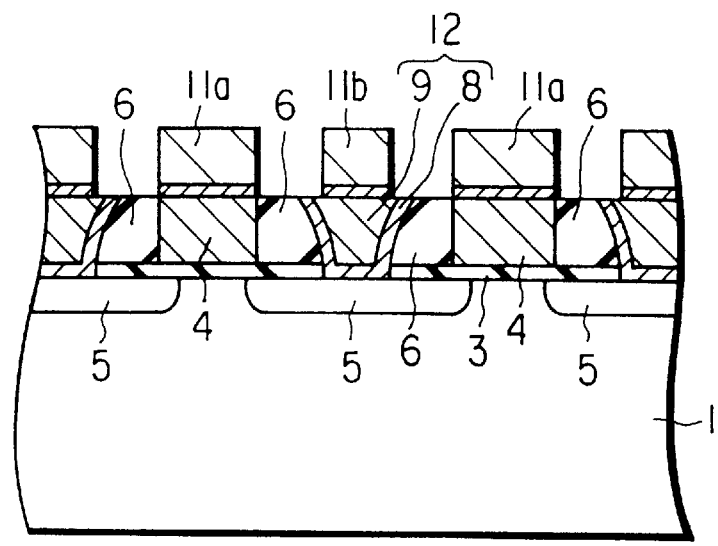
F I G. 17
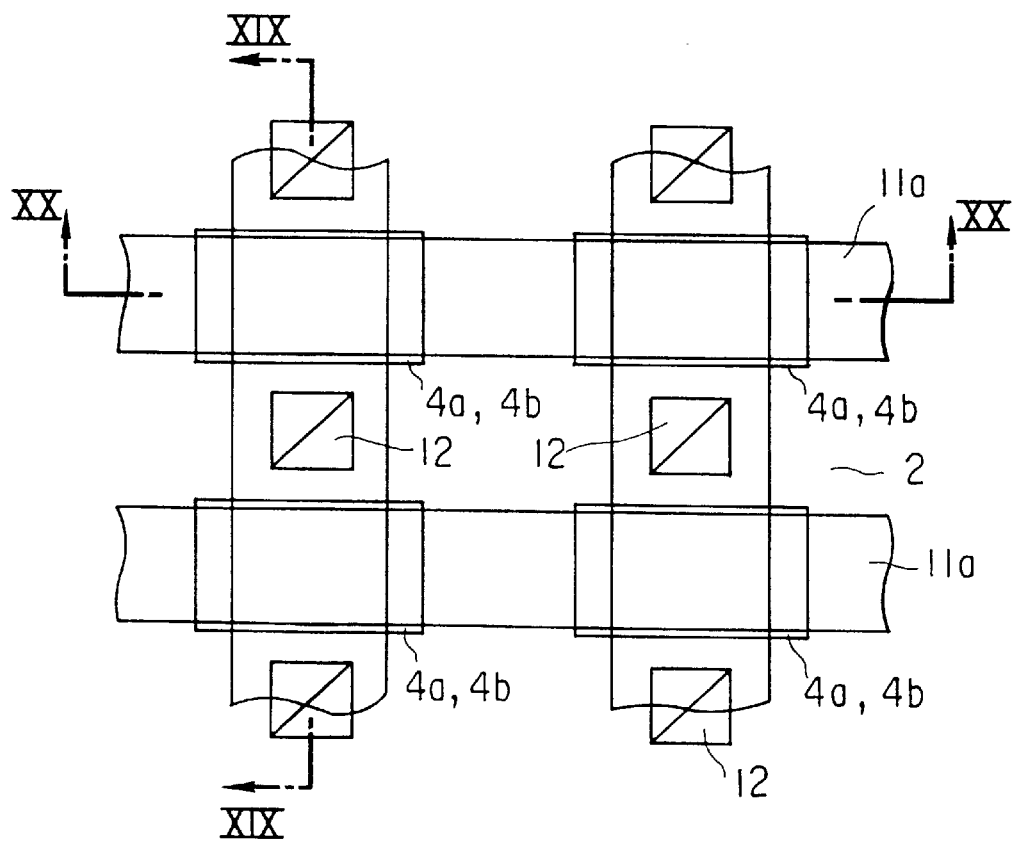
F I G. 18

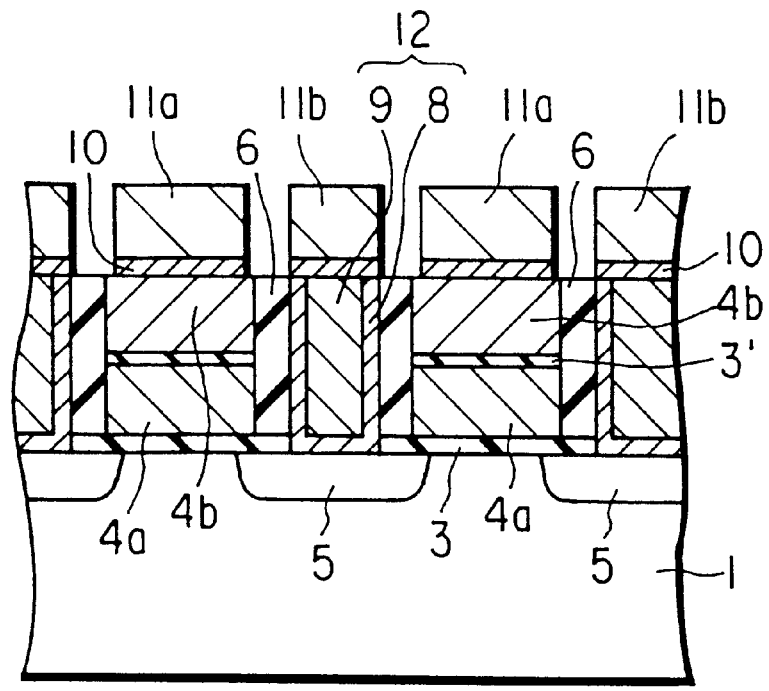
F I G. 19
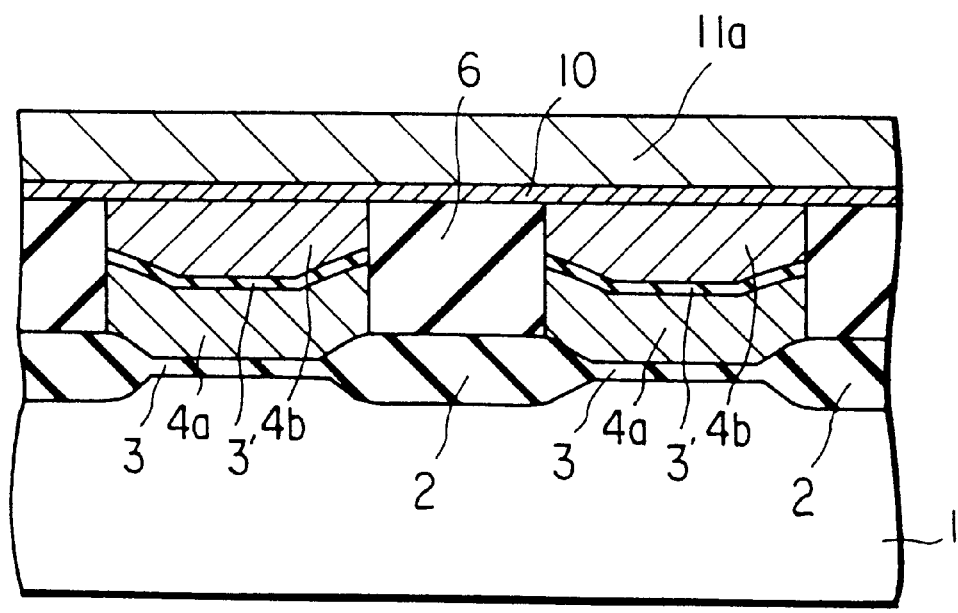
F I G. 20

MOS GATE STRUCTURE SEMICONDUCTOR DEVICE

BACKGROUND OF THE INVENTION

The present invention relates to a semiconductor device, in which delay of a gate used for, for example, a high-speed transistor, a very high-speed memory, etc. is reduced, and relates to a producing method of such a semiconductor device.

Conventionally, a gate electrode of a MOS transistor or the like and a wiring layer over the gate electrode are connected via a connecting hole which is formed in an interlayer insulating film on the gate electrode.

In the above arrangement, after the interlayer insulating film is formed on the gate electrode formed on a semiconductor substrate and the connecting hole is made in the interlayer insulating film, the wiring layer, for example, is deposited thereon.

However, as a semiconductor device is highly integrated and a semiconductor element is made minute in recent years, an area of the connecting hole has a tendency to be decreased. Moreover, as a semiconductor element is highly integrated, a wiring layer is being multi-layered, and thus a thickness of an interlayer insulating film has a tendency to become thicker in order to smooth unevenness due to the multi-layered wiring layer. For this reason, a depth of the connecting hole becomes deeper, and thus it is very difficult to sufficiently deposit an electrically conductive material composing a wiring layer in a connecting hole with a small area and with a deep depth.

On the contrary, a method of depositing an electrically conductive electrode material with high coverage and low resistance into a connecting hole and connecting a gate electrode to a wiring layer via the electrically conductive electrode material has been proposed.

However, this method possibly influences a driving speed of a transistor, for example, and thus possibly reduces a high-speed operation of the transistor because resistance of a buried electrode, connecting resistance between the buried electrode and the gate electrode, and connecting resistance between the buried electrode and the wiring layer are added to resistance of the gate electrode.

The resistance added to the gate electrode possibly increases a delay in driving a word line of a non-volatile semiconductor memory or the like. For this reason, the number of memory cells, which can be connected to one word line which is connected to a circuit for controlling word lines such as a word line decoder, is limited.

Further, in the case the connecting hole is made on the gate electrode by using a patterning technique, it is necessary to provide an aligning margin in patterning between the gate electrode and the connecting hole, and thus it is difficult to make an element minute.

As mentioned above, in accordance with the conventional semiconductor device and the producing method thereof, it is difficult to reduce the resistance between the gate electrode and the wiring layer formed on the gate electrode and to make an element minute.

BRIEF SUMMARY OF THE INVENTION

It is an object of the present invention to provide a high-speed and highly-integrated semiconductor device which is capable of reducing resistance between a gate electrode and a wiring layer formed on the gate electrode and of making an element minute, and to provide a method of producing such a semiconductor device.

To achieve the above object, according to the present invention, there is provided a semiconductor device, comprising: a gate electrode formed on a semiconductor substrate; a diffusion layer formed on a surface region of the semiconductor substrate; a buried electrode formed on the semiconductor substrate so as to be connected to the diffusion layer; an interlayer insulating film buried in a space between the gate electrodes and in a space between the gate electrode and the buried electrode; and a wiring layer formed so as to be connected to the gate electrode or the buried electrode; wherein a height of surface of the gate electrode and a height of surface of the buried electrode and a height of a surface of the interlayer insulating film are equal and the surfaces of the gate electrode, the buried electrode and the interlayer insulating film form a plane, wherein the wiring layer is formed on the plane so as to be directly connected to the surfaces of the gate electrode and the buried electrode.

According to the present invention, there is further provided a semiconductor device, comprising: a first gate electrode formed on a semiconductor substrate, the first gate electrode being patterned; a second gate electrode formed on an insulating film which is formed on the first gate electrode, the second gate electrode being patterned equally with the first gate electrode; a wiring layer formed so as to be connected to the second gate electrode; a diffusion layer formed on a surface region of the semiconductor substrate; a buried electrode formed so as to be connected to the diffusion layer; and an interlayer insulating film buried in a space between the first and second gate electrodes, wherein a height of surface of the second gate electrode, a height of surface of the buried electrode and a height of a surface of the interlayer insulating film are equal so that the surfaces of the second gate electrode, the buried electrode and the interlayer insulating film form a plane, wherein the wiring layer is formed on the plane so as to be directly connected to the surfaces of the second gate electrode and the buried electrode.

According to the present invention, there is further provided a method of producing a semiconductor device, comprising the steps of: forming a gate electrode on a semiconductor substrate; forming a diffusion layer on a surface region of the semiconductor substrate; forming an interlayer insulating film on the gate electrode and on the semiconductor substrate; removing the interlayer insulating film until surface of the gate electrode is exposed so as to bury the interlayer insulating film in a space between the gate electrodes; removing one portion of the buried interlayer insulating film until the diffusion layer is exposed so as to form a connecting hole; forming an electrically conductive film in the connecting hole, on the gate electrode and on the interlayer insulating film; removing the electrically conductive film on the gate electrode and on the interlayer insulating film, and letting the electrically conductive film remain in the connecting hole, and forming buried electrode so as to be connected to the diffusion layer, and polishing the electrically conductive film until the gate electrode are exposed so that a height of surface of the buried electrode, a height of surface of the gate electrode and a height of a surface of the interlayer insulating film are equal and that the surfaces of the gate electrode, the buried electrode and the interlayer insulating film form a plane; and forming a wiring layer on the plane so as to be connected to the exposed gate electrode and the buried electrode.

According to the present invention, there is further provided a method of producing a semiconductor device, comprising the steps of: forming a gate electrode on a semiconductor substrate; forming a diffusion layer on a surface region of the semiconductor substrate; forming an interlayer insulating film on the gate electrode and on the semiconductor substrate; forming a connecting hole by removing one portion of the interlayer insulating film until the diffusion layer is exposed; forming an electrically conductive film in the connecting hole and on the interlayer insulating film; removing the electrically conductive film on the gate electrode and the interlayer insulating film, and letting the electrically conductive film remain in the connecting hole, and forming a buried electrode so as to be connected to the diffusion layer, and polishing the electrically conductive film and the interlayer insulating film until the gate electrode is exposed so that a height of surface of the buried electrode, a height of surface of the gate electrode and a height of a surface of the interlayer insulating film are equal and that the surfaces of the gate electrode, the buried electrode and the interlayer insulating film form a plane; and forming a wiring layer on the plane so as to be connected to the exposed gate electrode and the buried electrode.

According to the present invention, there is further provided a method of producing a semiconductor device, comprising the steps of: forming a gate electrode, on which an insulating film is layered, on a semiconductor substrate; forming a diffusion layer on a surface region of the semiconductor substrate; forming an interlayer insulating film on the gate electrode and on the semiconductor substrate; etching the interlayer insulating film by an anisotropic etching technique until the diffusion layer is exposed so as to form a connecting hole; forming an electrically conductive film in the connecting hole and on the insulating film on the gate electrode; removing the electrically conductive film on the gate electrode and the interlayer insulating film, and letting the electrically conductive film remain in the connecting hole, and forming buried electrode so as to be connected to the diffusion layer, and polishing the electrically conductive film and the interlayer insulating film until the gate electrode is exposed so that a height of surface of the buried electrodes, a height of surface of the gate electrode and a height of a surface of the interlayer insulating film are equal and that the surfaces of the gate electrode, the buried electrode and the interlayer insulating film form a plane; and forming a wiring layer on the plane so as to be connected to the exposed gate electrode and the buried electrode.

According to the present invention, there is further provided a method of producing a semiconductor device, comprising the steps of: forming a first electrically conductive film on a semiconductor substrate; forming a second electrically conductive film on an insulating film which is formed on the first electrically conductive film; etching the second electrically conductive film, the insulating film and the first electrically conductive film so as to form a floating gate electrode on the semiconductor substrate and a control electrodes on the floating gate electrode; forming a diffusion layer in a surface region of the semiconductor substrate; forming an interlayer insulating film on the control gate electrode and on the semiconductor substrate; removing the interlayer insulating film until surface of the control gate electrode is exposed so as to bury the interlayer insulating film in space between the control gate electrode and the floating gate electrode; removing a portion of the buried interlayer insulating film until the diffusion layer is exposed so as to form a connecting hole; forming a third electrically conductive film in the connecting hole, on the control gate electrode and on the interlayer insulating film; removing the third electrically conductive film on the control gate electrode and on the interlayer insulating film, and letting the third electrically conductive film remain in the connecting hole, and forming a buried electrode so as to be connected to the diffusion layer, and polishing the third electrically conductive film until the control gate electrode is exposed so that a height of surface of the buried electrode, a height of surface of the control gate electrode and a height of a surface of the interlayer insulating film are equal and that the surfaces of the control gate electrode, the buried electrode and the interlayer insulating film form a plane; and forming a wiring layer on the plane so as to be connected to the exposed control gate electrode and the buried electrode.

According to the present invention, there is further provided a method of producing a semiconductor device, comprising the steps of: forming a first electrically conductive film on a semiconductor substrate; forming a second electrically conductive film on an insulating film which is formed on the first electrically conductive film; etching the second electrically conductive film, the insulating film and the first electrically conductive film so as to form a floating gate electrode on the semiconductor substrate and control gate electrode on the floating gate electrode; forming diffusion layer in a surface region on the semiconductor substrate; forming an interlayer insulating film on the control gate electrode and on the semiconductor substrate; removing a portion of the interlayer insulating film until the diffusion layer is exposed so as to form a connecting hole; forming a third electrically conductive film in the connecting hole and on the interlayer insulating film; removing the interlayer insulating film on the control gate electrode and the third electrically conductive film, and letting the third electrically conductive film remain in the connecting hole, and forming a buried electrode so as to be connected to the diffusion layer, and polishing the third electrically conductive film and the interlayer insulating film until the control gate electrode is exposed so that a height of surface of the buried electrode, a height of surface of the control gate electrode and a height of a surface of the interlayer insulating film are equal and that the surfaces of the control gate electrode, the buried electrode and the interlayer insulating film form a plane; and forming a wiring layer on the plane so as to be connected to the exposed control gate electrode and the buried electrode.

According to the present invention, there is further provided a method of producing a semiconductor device, comprising the steps of: forming a first electrically conductive film on a semiconductor substrate; forming a second electrically conductive film on an insulating film which is formed on a first insulating film which is formed on the first electrically conductive film; forming a second insulating film on the second electrically conductive film; etching the second insulating film, the second electrically conductive film, the first insulating film and the first electrically conductive film so as to form a floating gate electrode on the semiconductor substrate and a control gate electrode on the floating gate electrode; forming a diffusion layer in a surface region on the semiconductor substrate; forming an interlayer insulating film on the second insulating film and on the semiconductor substrate; etching the interlayer insulating film by an anisotropic etching technique until the diffusion layer is exposed so as to form a connecting hole; forming a third electrically conductive film in the connecting hole and on the third insulating film; removing the interlayer insulating film on the control gate electrode and the third electrically conductive film, and letting the third electrically conductive film remain in the connecting hole, and forming a buried electrode so as to be connected to the diffusion layer, and polishing the third electrically conductive film and the interlayer insulating film until the control gate electrode is exposed so that a height of surface of the buried electrode, a height of surface of the control gate electrode and a height of a surface of the interlayer insulating film are equal and that the surfaces of the control gate electrode, the buried electrode and the interlayer insulating film form a plane; and forming a wiring layer on the plane so as to be connected to the exposed control gate electrode and the buried electrode.

In the semiconductor device of the present invention, since surfaces of gate electrodes, surfaces of buried electrodes which are formed so as to be connected to diffusion layers and a surface of an interlayer insulating film have the same height, then the surfaces of the gate electrodes, the surfaces of the buried electrodes and the surface of the interlayer insulating film form a common plane. A wiring layer is formed on the plane, and thus the wiring layer to be formed on the plane can be easily patterned and etched as compared with the conventional case where there is a great difference in height.

In addition, since the wiring layer is directly connected to the surfaces of the gate electrodes and to the surfaces of the buried electrodes, as compared with the conventional case of connecting via connecting holes, connection resistance can be reduced. In particular, it is difficult to sufficiently bury a wiring material into minute connecting holes, however in the semiconductor device of the present invention, burying a wiring material into minute connecting holes are not required since the surfaces of the gate electrodes, the surfaces of the buried electrodes and the surface of the interlayer insulating film have the same height, and the wiring layer is directly formed on these surfaces, so that a sufficient contact area between the gate electrode and the wiring layer can be obtained in the minute semiconductor device, thereby reducing the connection resistance sufficiently.

In addition, since connecting holes are not required, the semiconductor device can be made minute.

In addition, in the semiconductor device of the present invention, first gate electrodes and second gate electrodes formed on a semiconductor substrate are patterned uniformly, and the interlayer insulating film is buried into spaces between the first and second gate electrodes. Moreover, the surfaces of the buried electrodes, the surfaces of the second gate electrodes and the surface of the interlayer insulating film have the same height, and the surfaces of the gate electrodes, the surfaces of the buried electrodes and the surface of the interlayer insulating film form a plane, and the wiring layer is formed on the plane. For this reason, the wiring layer, which is directly connected to the second gate electrodes and to the buried electrodes, can be easily formed.

Conventionally, in the case where the gate electrode has a two-layered structure, since a difference in level becomes larger due to the gate electrode, it is difficult to process the wiring layer formed over the gate electrodes. However, in the semiconductor device of the present invention, since the wiring layer is formed on the plane, the wiring layer can be easily patterned and etched. For this reason, it is possible to finish a minute wiring layer, and to highly integrate the semiconductor device.

In particular, since the surfaces of the second gate electrodes, the surfaces of the buried electrodes to be connected to the diffusion layers adjacent to the gate electrodes, and the surface of the interlayer insulating film between the buried electrodes and the second electrodes form a plane, the wiring layer to be connected to the second gate electrodes can be easily patterned and etched with the wiring layer connected to the diffusion layers adjacent to the second gate electrodes via the buried electrodes. As a result, distance between these wiring layers can be shortened, thereby making it possible to make the semiconductor device minute.

In addition, since the wiring layer is directly connected to the surfaces of the second gate electrodes, the contact area between the wiring layer and the second gate electrode can be obtained, thereby making it possible to reduce the connection resistance.

Further, since a connecting hole is not required, an aligning margin, for patterning between the connecting hole and the second gate electrode is not required. As a result, it is possible to make the semiconductor device minute.

In addition, in general, the resistance of the wiring layer can be reduced more than the resistance of the gate electrode material. For this reason, in the semiconductor device of the present invention, where the first and second gate electrodes are patterned uniformly, and the second gate electrodes are connected to the wiring layer formed on the second gate electrodes, a length of the wiring can be made longer than in the conventional semiconductor device in which only the first gate electrodes are patterned, and the second gate electrodes are used as the wiring layer. For this reason, the length of the wiring can be made longer, and thus the semiconductor device can be highly integrated.

Furthermore, compared with the conventional semiconductor device in which the second gate electrode is processed with unevenness due to the processed first gate electrode existing, since the first gate electrodes and the second gate electrodes can be patterned simultaneously, they can be easily processed. As a result, a minute semiconductor device can be formed.

In addition, in a method of producing a semiconductor device of the present invention, after an interlayer insulating film is buried in spaces between gate electrodes, connecting holes are formed, and an electrically conductive film is formed in the connecting holes, on the gate electrodes and on the interlayer insulating film, and the wiring layer is formed so as to be connected to the gate electrodes and to the buried electrodes. However, in this polishing step, the electrically conductive film is polished until the gate electrodes is exposed so that the height of the surfaces of the buried electrodes, the height of the surfaces of the gate electrodes and the height of the surface of the interlayer insulating film are equal, and that the surfaces of the gate electrodes, the buried electrodes and the interlayer insulating film form a plane, and a wiring layer is formed on the plane. As a result, a semiconductor device of the present invention which has the aforementioned arrangement can be produced. For this reason, as mentioned above, a minute semiconductor device, in which connection resistance between the gate electrodes and the wiring layer is low, can be produced.

In addition, in a method of producing a semiconductor device of the present invention, after an interlayer insulating film is formed so as to cover gate electrodes, connecting holes are formed without burying the interlayer insulating film in spaces between the gate electrodes, and an electrically conductive film is formed in the connecting holes and on the interlayer insulating film. Moreover, the electrically conductive film and the interlayer insulating film are polished until the gate electrodes are exposed and the electrically conductive film is buried in the connecting holes so that the buried electrodes are formed, and a wiring layer is formed on the exposed gate electrodes and on the buried electrodes. For this reason, the step of burying the interlayer insulating film in the spaces between the gate electrodes and the step of forming the buried electrodes can be carried out simultaneously. For this reason, the process can be simplified more than the aforementioned method.

In addition, in a method of producing a semiconductor device of the present invention, in the step of forming connecting holes in the aforementioned producing method, after the interlayer insulating film is formed so as to cover gate electrodes, the interlayer insulating film is etched by the anisotropic etching technique so that the connecting holes are formed. For this reason, the connecting holes can be formed in a self-aligning manner with the gate electrodes. For this reason, since a distance between the gate electrode and the connecting holes can be shortened, the semiconductor device can be made minute. Moreover, by previously layering the insulating film on the gate electrodes, when the electrically conductive film and the insulating film on the gate electrodes are polished until the gate electrodes are exposed in order that the buried electrodes are formed, the buried electrodes can be separated from the gate electrode.

In addition, in a method of producing a semiconductor device of the present invention, after floating gate electrodes on the semiconductor substrate and control gate electrodes on the floating gate electrodes are formed, an interlayer insulating film is buried in space between the control gate electrodes and the floating gate electrodes so that the surfaces of the control gate electrodes are exposed, connecting holes are formed, an electrically conductive film is formed, the electrically conductive film is polished until the control gate electrodes are exposed so that the buried electrodes are formed in the connecting holes, and a wiring layer is formed on the exposed control gate electrodes and on the buried electrodes. However, in this polishing step, the electrically conductive film is polished so that a height of surfaces of the buried electrodes, a height of surfaces of the control gate electrodes and a height of a surface of the interlayer insulating film are equal and that the surfaces of the control gate electrodes, the buried electrodes and the interlayer insulating film form a plane, and the wiring layer is formed on the plane. For this reason, as mentioned above, the patterning and etching of the wiring layer becomes easy greatly, and the minute wiring layer can be formed, thereby highly integrating the semiconductor device.

In addition, since the interlayer insulating film is polished until the gate electrodes are exposed, and the wiring layer is formed on the exposed gate electrodes, the wiring layer can be formed so as to be directly connected to the surfaces of the control gate electrodes. For this reason, the connection resistance between the control gate electrodes and the wiring layer can be reduced. Further, since the wiring layer can be formed so as to contact with a substantially whole surfaces of the gate electrodes, a contact area between the gate electrodes and the wiring layer can be maintained, thereby reducing the connection resistance.

In addition, since connecting hole is not formed, an aligning margin for patterning of the gate electrode and the connecting hole is not required, thereby making it possible to form a minute semiconductor device.

In addition, since the floating gate electrodes and the control gate electrodes are patterned and etched simultaneously, compared with the conventional producing method for after etching only floating gate electrodes, etching control gate electrodes with unevenness due to the etched floating gate electrodes existing, the process of the control gate electrodes becomes particularly easy, thereby making it possible to form a more minute semiconductor device.

Furthermore, in a method of producing a semiconductor device of the present invention, after floating gate electrodes on a semiconductor substrate and control gate electrodes on the floating gate electrodes are formed, an interlayer insulating film is formed so as to cover the control gate electrodes, connecting holes are formed without burying the interlayer insulating film in spaces between the gate electrodes, an electrically conductive film is formed in the connecting holes and on the interlayer insulating film, the electrically conductive film and the interlayer insulating film are polished until the control gate electrodes are exposed so that buried electrodes are formed by the electrically conductive film in the connecting hole, and a wiring layer is formed on the exposed control gate electrodes and on the buried electrodes. For this reason, the step of burying the interlayer insulating film in spaces between the control gate electrodes and the step of forming the buried electrodes can be carried out simultaneously. For this reason, the process can be simplified more than the aforementioned method.

In addition, in a method of producing a semiconductor device of the present invention, after floating gate electrodes on a semiconductor substrate and control gate electrodes on the floating gate electrodes are formed, and an interlayer insulating film is formed on the control gate electrodes, the interlayer insulating film is etched by an anisotropic etching technique so that connecting holes are formed. For this reason, the connecting holes can be formed in a self-aligning manner with the control gate electrodes and the floating gate electrodes. For this reason, since a distance between the control gate electrodes or the floating gate electrodes and the connecting holes can be shortened, the semiconductor device can be made minute. Moreover, by previously layering an insulating film on the control gate electrodes, when the electrically conductive film and the insulating film on the control gate electrodes are polished until the control gate electrodes are exposed, the buried electrodes can be separated from the control gate electrodes.

For a fuller understanding of the nature and advantages of the invention, reference should be made to the ensuing detailed description taken in conjunction with the accompanying drawings.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view which shows an arrangement of a semiconductor device according to a first embodiment of the present invention;

FIG. 2 is a cross sectional view which shows a method of producing the semiconductor device according to the first embodiment of the present invention;

FIG. 3 is a cross sectional view which shows the method of producing the semiconductor device according to the first embodiment of the present invention;

FIG. 4 is a cross sectional view which shows the method of producing the semiconductor device according to the first embodiment of the present invention;

FIG. 5 is a cross sectional view which shows the method of producing the semiconductor device according to the first embodiment of the present invention;

FIG. 6 is a cross sectional view which shows the method of producing the semiconductor device according to the first embodiment of the present invention;

FIG. 7 is a cross sectional view which shows the method of producing the semiconductor device according to the first embodiment of the present invention;

FIG. 10 is a cross sectional view which shows the method of producing the semiconductor device according to the second embodiment of the present invention;

FIG. 11 is a cross sectional view which shows the method of producing the semiconductor device according to the second embodiment of the present invention;

FIG. 15 is a cross sectional view which shows the method of producing the semiconductor device according to the third embodiment of the present invention;

FIG. 16 is a cross sectional view which shows the method of producing the semiconductor device according to the third embodiment of the present invention;

FIG. 17 is a cross sectional view which shows the method of producing the semiconductor device according to the third embodiment of the present invention;

FIG. 18 is a top plan view which shows an arrangement of a semiconductor device according to a fourth embodiment of the present invention;

FIG. 19 is a cross sectional view which shows the arrangement of the semiconductor device according to the fourth embodiment of the present invention, taken along line XIX—XIX in FIG. 18; and FIG. 20 is a cross sectional view which shows the arrangement of the semiconductor device according to the fourth embodiment of the present invention, taken along line XX—XX in FIG. 18.

DETAILED DESCRIPTION OF THE INVENTION

Figure 8:
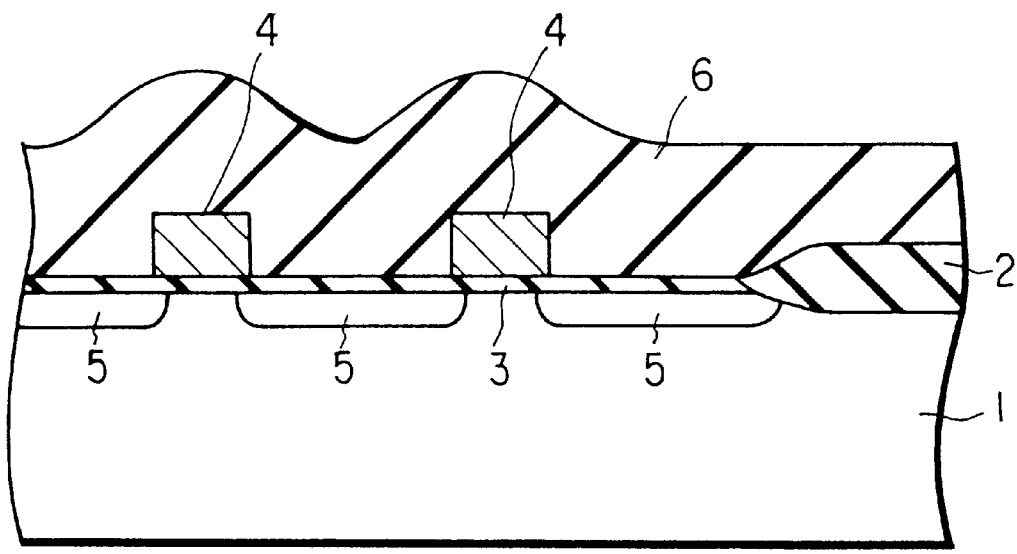
FIG. 8 is a cross sectional view which shows a method of producing a semiconductor device according to a second embodiment of the present invention.

The following describes embodiments of the present invention with reference to the drawings.

FIG. 1 is a cross sectional view which shows an arrangement of a semiconductor device according to a first embodiment of the present invention. As shown in FIG. 1, the semiconductor device according to the present embodiment is arranged so as to have gate electrodes 4, interlayer insulating films 6, buried electrodes 12, and wiring layers 11a and 11b. The gate electrodes 4 are formed on gate insulating films 3 which are formed over a semiconductor substrate 1, where, for example, an element separation region 2 and diffusion layers 5 are formed. The interlayer insulating film 6 is buried into a space, i.e., on a region of the semiconductor substrate 1, which is between the adjacent gate electrodes 4 so as to be level with the gate electrodes 4. The buried electrode 12 is connected to the diffusion layer 5 and is buried so as to be level with the gate electrodes 4. The wiring layers 11a and 11b are formed so as to be directly connected to the gate electrode 4 and to the buried electrode 12 respectively. Here, the semiconductor device is characterized in that the heights of the surfaces of the gate electrode 4, the buried electrode 12 and the interlayer insulating film 6 are equal, and that the wiring layers 11a and 11b are formed on a plane formed by the surfaces of the gate electrode 4, the buried electrode 12 and the interlayer insulating film 6.

As mentioned above, the semiconductor device of the present embodiment is different from the conventional semiconductor device where a gate electrode is connected to a wiring layer via a connecting hole, in that the wiring layer 11a is directly connected to the surface of the gate electrode 4. For this reason, it is possible to overcome such a problem that the wiring layer material is not filled into a minute connecting hole, thereby making it possible to reduce connection resistance.

In addition, since the wiring layers 11a and 11b are formed on the plane formed by the surfaces of the gate electrode 4, the buried electrode 12 and the interlayer insulating film 6, the wiring layers 11a and 11b can be formed so as to have the uniform thickness, thereby suppressing variation of wiring resistance.

Furthermore, since the wiring layers are formed on the plane formed by the surfaces of the gate electrode 4, the buried electrode 12 and the interlayer insulating film 6, it becomes easy to process the wiring layers 11a and 11b through the lithography method and the etching method, thereby arranging the minute semiconductor device with high reliability. In particular, it is necessary to remove a very narrow width portion of the wiring layer material, which is between the wiring layers 11a and 11b which are respectively connected to the gate electrode 4 and to the buried electrode 12. In this respect, as shown in FIG. 1, when the surfaces of the gate electrode 4, the buried electrode 12 and the interlayer insulating film 6 therebetween form a plane, it becomes very easy to remove the narrow width portion of the wiring layer material and process the wiring layers 11a and 11b through the lithography method and the etching method.

In addition, since the contact area between the wiring layer 11a and the gate electrode 4 can be increased more than the conventional method of forming a connecting hole on a gate electrode 4 by patterning, the connection resistance can be reduced.

Further, because of the arrangement which does not require an aligning margin in patterning the connecting hole on the gate electrode 4, the semiconductor device can be made minute.

The following describes a method of realizing the above arrangement with reference to FIGS. 2 through 7. FIGS. 2 through 7 show a first embodiment of the producing method of the semiconductor device of the present invention.

First, the element separation region 2 is formed on the semiconductor substrate 1, and the gate electrodes 4 are formed on the gate insulating film 3 such as oxide film.

Further, source/drain regions 5 are formed in the semiconductor substrate 1, and thereafter the interlayer insulating film 6 is formed (FIG. 2).

Thereafter, the interlayer insulating film 6 is polished so as to be removed by, for example, the CMP (chemically mechanical polishing) method, until the surfaces of the gate electrodes 4 are exposed (FIG. 3).

Further, connecting holes 7 are opened in the interlayer insulating film 6 by the normal lithography method and etching technique, until the surfaces of the diffusion layers 5 are exposed (FIG. 4).

Next, a barrier metal layer 8 made of, for example, Ti and TiN layered films is formed on the exposed surfaces of the connecting holes 7 and on the interlayer insulating film 6, and an electrically conductive film 9 made of a refractory metal, etc. such as W is formed in the connecting holes 7 and on the interlayer insulating film 6 so that the insides of the connecting holes 7 are filled with the electrically conductive film material (FIG. 5).

Further, the electrically conductive film 9 and the barrier metal 8 are polished by, for example, the CMP method, until the gate electrodes 4 are exposed so that the electrically conductive film 9 and the barrier metal 8 on the gate electrodes 4 and on the interlayer insulating film 6 are removed, to thereby form the electrically conductive buried film 9 and the buried barrier metal 8 in the connecting holes 7 so that the buried electrodes 12 connected to the diffusion layers 5 are formed (FIG. 6).

Thereafter, a barrier metal layer 10 made of, for example, Ti and TiN layered films, and the wiring layer 11 made of, for example, Al are formed on the buried electrodes 12, on the gate electrodes 4, and on the interlayer insulating film 6 (FIG. 7).

Further, the wiring layer 11 and the barrier metal layer 10 are etched by, for example, the normal lithography method and etching technique so that a semiconductor device is formed (FIG. 1).

As mentioned above, in the method of producing a semiconductor device according to the present embodiment, the surfaces of the gate electrodes 4 and the buried electrodes 12 are exposed by a polishing technique, such as the CMP method, and the wiring layer 11 is formed on the exposed surfaces.

As mentioned above, by using the CMP method, before forming the wiring layer 11, the surfaces of the gate electrodes 4 under the wiring layer 11, the buried electrodes 12 and the interlayer insulating film 6 can be smoothed more sufficiently than the case of using a resist etch-back method, for example. For this reason, in the conventional method of opening connecting holes in the interlayer insulating film 6, and directly forming the wiring layer 11 in the connecting holes, it is difficult to form the wiring layer 11 in minute connecting holes, and thus the connection resistance is increased. However, in the present embodiment, since the surfaces of the gate electrodes 4 and the surfaces of the buried electrodes 12 are exposed so that they form a plane together with the surface of the interlayer insulating film 6, the wiring layer 11 can be formed easily, and the connection resistance between the wiring layer 11 and the gate electrodes 4 or the buried electrodes 12 can be reduced.

In addition, the diffusion layer region 5 is usually larger than the gate electrode 4. For this reason, the connecting hole 7, which is formed so as to be connected to the diffusion layer region 5, can be formed so as to have a larger area than the conventional connecting hole which is formed so as to be connected to the gate electrode 4. For this reason, the electrically conductive film 9 can be buried into the connecting holes 7 more easily compared with the conventional method of burying the electrically conductive film into the connecting holes connected to the gate electrodes.

In addition, since unevenness of a lower layer is smoothed when the wiring layer is formed, a more minute wiring can be formed in the lithography step. Moreover, a problem such as an non-etched portion can be avoided in the etching step, and thus, the process can be easier.

In addition, in the case where a wiring layer is formed thereon, since the unevenness due to the gate electrodes 4 is smoothed substantially completely, the wiring layer can be processed more easily.

In addition, minute scratches are formed on the surfaces of the gate electrodes 4 due to the polishing by the CMP method. For this reason, when the wiring layer 11 is joined to the surfaces of the gate electrodes 4 and an electric current is let flow, the scratches become centers of recombination of carriers, and a large amount of recombination currents flow. As a result, Ohmic junction of an interface between the gate electrodes 4 and the wiring layer 11 is improved, and thus the connection resistance can be reduced.

Further, in the polishing by the CMP method, a damage due to plasma can be reduced more than the removing method by the resist etch-back method, for example, and thus a semiconductor device with high reliability can be produced.

In addition, in the semiconductor device such as a memory, space widths between the gate electrodes 4 in a memory region composed of memory cells greatly differ from those in a peripheral circuit region composed of peripheral circuits which drive the memory cells. Namely, the interval between the gate electrodes 4 is narrow in the memory region, and the interval between the gate electrodes 4 is wide in the peripheral circuit region. For this reason, when the interlayer insulating film 6 is deposited, the interlayer insulating film 6 with a large thickness is formed in the space between the gate electrodes 4 in the memory region, and the interlayer insulating film with a small thickness is formed in the space between the gate electrodes 4 in the peripheral circuit region. In the case where the interlayer insulating film 6 is removed in this state until the surfaces of the gate electrodes 4 are exposed, an etching quantity required in the memory region and in the peripheral circuit region is different from each other. In the case where the etching step is executed by the resist etch-back method, for example, since the etching of the interlayer insulating film 6 is executed by the same quantity in both regions, it is very difficult to etch the gate electrodes 4 and the interlayer insulating film 6 so that their surfaces make a plane in the memory region and the peripheral circuit region. On the contrary, in the case of using the CMP method as in the present invention, since the interlayer insulating film 6 is polished so that the height of the surfaces in both regions becomes uniform, even if such regions, where the gate electrodes 4 have different pattern densities, exists the interlayer insulating film can be smoothed, while uniformly exposing the surfaces of the gate electrodes 4.

In addition, since it is not necessary to form an etching material such as a resist in the CMP method unlike the resist etch-back method, for example, the throughput can be improved.

The following describes a second embodiment of the producing method, which realizes the semiconductor device shown in FIG. 1, with reference to FIGS. 8 through 11.

First, in the same manner as the first embodiment, the interlayer insulating film 6 is formed on the gate electrodes 4 which are formed on the semiconductor substrate 1. FIG. 8 shows a state which is the same as FIG. 2.

Figure 9:
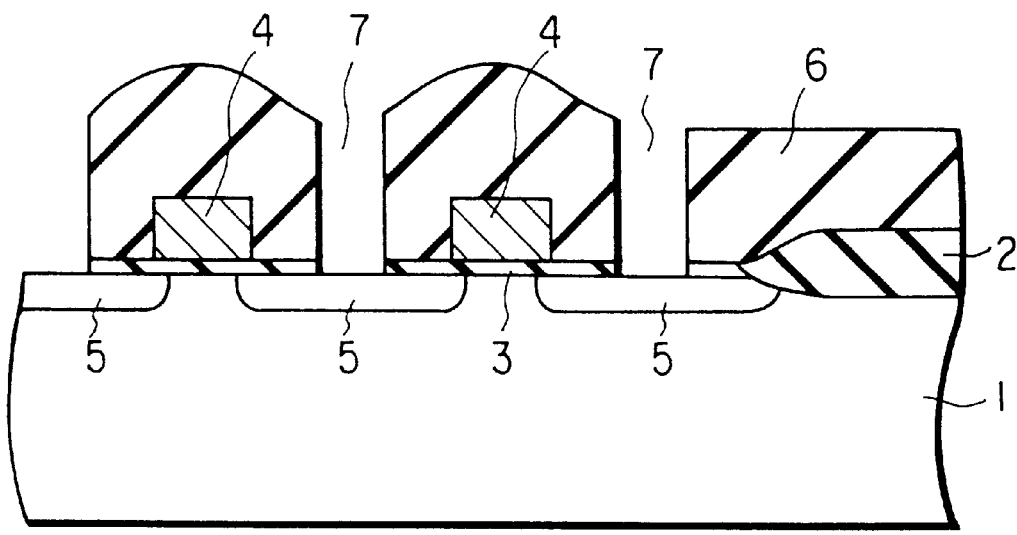
FIG. 9 is a cross sectional view which shows the method of producing the semiconductor device according to the second embodiment of the present invention.

Next, unlike the aforementioned first embodiment in which the interlayer insulating film 6 is smoothed by the CMP method, the interlayer insulating film 6 is not smoothed, and the connecting holes 7 are formed by the normal lithography method and the etching technique so that the semiconductor substrate 1 is exposed (FIG. 9).

Thereafter, in the same manner as the first embodiment, the barrier metal layer 8 made of Ti and TiN layered films, etc. is formed on the exposed surfaces of the connecting holes 7 and on the interlayer insulating film 6, and the electrically conductive film 9 made of refractory metal, etc. such as W is formed in the connecting holes 7 and the interlayer insulating film 6 so that the connecting holes 7 are filled up (FIG. 10).

Further, the electrically conductive film 9, the barrier metal 8 and the interlayer insulating film 6 are polished by the CMP method, for example, until the gate electrodes 4 are exposed. In such a manner, the electrically conductive film 9, the barrier metal 8 and the interlayer insulating film 6 on the gate electrodes 4 are removed, and the electrically conductive film 9 and the barrier metal 8 are buried in the connecting holes 7 so that the buried electrodes 12 connected to the diffusion layers 5 are formed (FIG. 11). FIG. 11 shows the same state as FIG. 6 in the first embodiment.

Thereafter, in the same manner as the first embodiment, the barrier metal layer 10 made of Ti and TiN layered films, etc., which is connected to the buried electrodes 12 and the gate electrodes 4, is formed, and the wiring layers 11a and 11b made of Al, for example, are formed. Then, the semiconductor device shown in FIG. 1 is finished.

As mentioned above, the present embodiment is different from the first embodiment in that the connecting holes 7 are opened without smoothing the interlayer insulating film 6, and the interlayer insulating film 6 is etched at the same time the etching step of burying the electrically conductive film 9 in the connecting holes 7. Moreover, it is a characteristic of the present invention to execute the etching step by the CMP method.

For this reason, in addition to the effect by the first embodiment, the following effect is produced. Namely, in the first embodiment, it is necessary to execute etching step twice, i.e., the etching step of smoothing the interlayer insulating film 6 and the etching step of forming the buried electrodes 12, but in the present embodiment, the etching step can be reduced to one by simultaneously executing these etching steps. In such a manner, the producing step is simplified and a time required for the production is shortened so that the production cost can be reduced.

In addition, in general, in the etching step by the CMP method, the etching condition can be easily set so that the etching speed is not influenced by a material to be etched. For this reason, like the present embodiment, when the electrically conductive film 9 and the interlayer insulating film 6 are etched simultaneously by the CMP method, the etching step becomes easier than the case of using the resist etch-back method, for example.

The following describes the case where the connecting holes 7 are formed on the diffusion layers 5 by self-aligning with the gate electrodes 4 as the third embodiment of the producing method of the semiconductor device of the present invention on reference to FIGS. 12 through 17.

Figure 12:
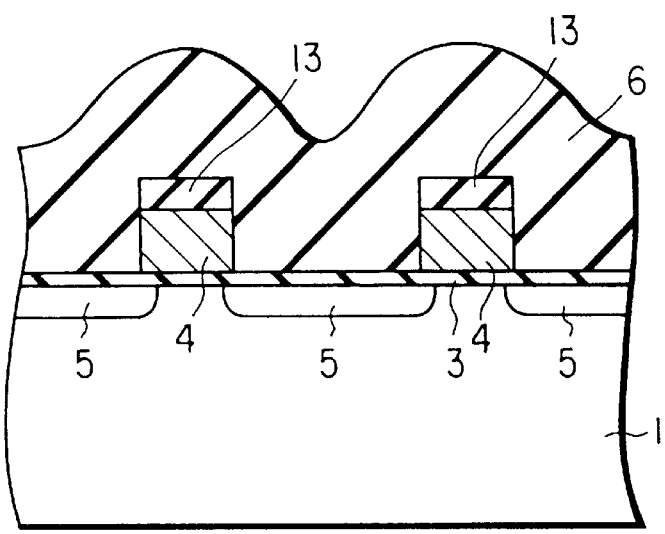
FIG. 12 is a cross sectional view which shows a method of producing a semiconductor device according to a third embodiment of the present invention.

First, unlike the first and second embodiments, in the present embodiment, the gate electrodes 4 are formed on the semiconductor substrate 1, and insulating films 13 which are layered on the gate electrodes 4 respectively are formed. Next, the interlayer insulating film 6 is formed on the gate electrodes 4 and the insulating films 13 (FIG. 12).

Figure 13:
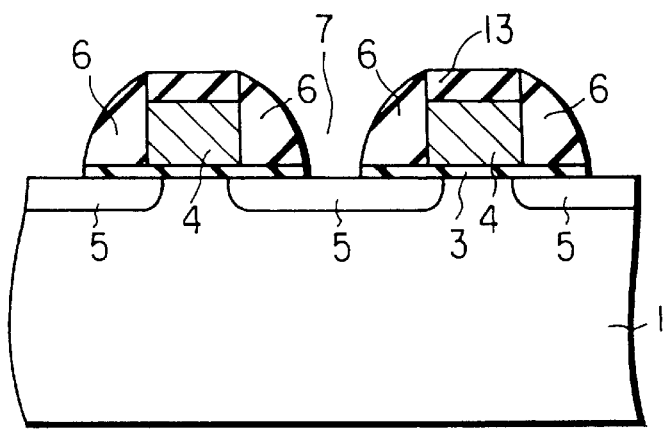
FIG. 13 is a cross sectional view which shows the method of producing the semiconductor device according to the third embodiment of the present invention.

Thereafter, the interlayer insulating film 6 is etched by the anisotropic etching technique such as RIE (reactive ion etching) until he semiconductor substrate 1 is exposed without smoothing the interlayer insulating film 6, and the interlayer insulating film 6 is let remain on the side walls of the gate electrodes 4 and the insulating films 13 (FIG. 13). As shown in FIG. 13, the gate electrodes 14 are covered with the insulating films 6 and 13, and the surface of the semiconductor substrate 1 is exposed in the region between the gate electrodes 4 so that the connecting holes 7 are formed.

Figure 14:
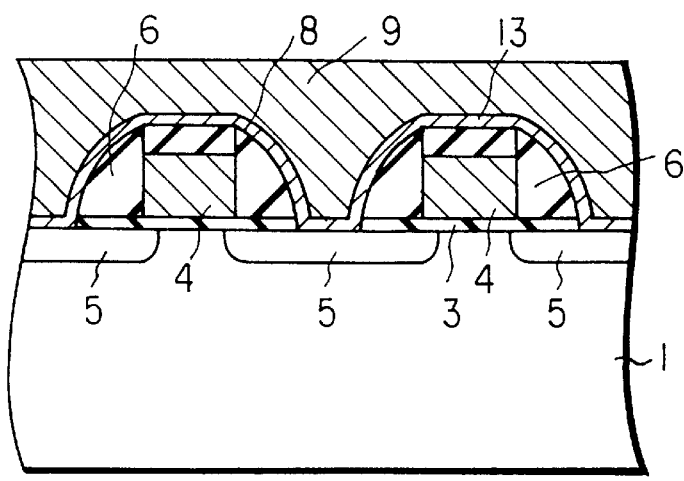
FIG. 14 is a cross sectional view which shows the method of producing the semiconductor device according to the third embodiment of the present invention.

Next, in the same manner as the first and second embodiments, the barrier metal layer 8 made of Ti and TiN layered films, etc. is formed on the exposed surface of the semiconductor substrate 1 and on the insulating films 6 and 13, and the electrically conductive film 9 made of refractory metal such as W, etc. is formed so that the connecting holes 7 are filled up (FIG. 14).

Further, the electrically conductive film 9, the barrier metal 8 and the insulating film 13 are polished by the CMP method, etc. until the gate electrodes 4 are exposed. In such a manner, the electrically conductive film 9, the barrier metal 8 and the insulating film 13 are removed from the gate electrodes 4, and the electrically conductive film 9 and the barrier metal 8 are buried in the spaces between the gate electrodes so that the buried electrodes 12 connected to the diffusion layers 5 respectively are formed (FIG. 15).

Thereafter, in the same manner as the first and second embodiments, the barrier metal layer 10 made of Ti and TiN films, etc. and the wiring layer 11 made of Al, etc. are formed on the exposed gate electrodes 4, the buried electrodes 12 and the insulating film 6 (FIG. 16).

Further, the wiring layer 11 and the barrier metal layer 10 are etched by the normal lithography method and etching technique, and the wiring layers 11a connected to the gate electrodes 4 respectively and the wiring layers 11b connected to the buried electrodes 12 respectively are formed so that the semiconductor device is finished (FIG. 17).

As mentioned above, the present invention is characterized in that the buried electrodes 12 are formed in the connecting holes 7 which are formed in a self-aligned manner with the gate electrodes 4 so that the surfaces of the gate electrodes 4 are exposed, and the wiring layers 11a and 11b are formed so as to be directly connected to the exposed surfaces of the gate electrodes 4 and the surfaces of the buried electrodes 12. Moreover, it is characterized in that the formation of the buried electrodes 12 and the exposure of the gate electrodes 4 are carried out by the CMP method.

As a result, in the present embodiment, in addition to the effect of the second embodiment, the following effect is produced. Namely, since the connecting hole can be formed in the self-aligned manner with the gate electrode 4, it is not necessary to provide an aligning margin for patterning of the gate electrode 4 and the connecting hole 7, and thus the semiconductor device can be made minute. Moreover, it is not necessary to pattern for forming the connecting hole 7, thereby making it possible to simplify the processing steps.

The following describes the case of applying the present invention to a non-volatile semiconductor memory as a fourth embodiment on reference to FIGS. 18 through 20.

FIG. 18 is a top view of the non-volatile semiconductor memory of the present invention, FIG. 19 is a cross sectional view taken on the line XIX—XIX in FIG. 18, and FIG. 20 is a cross sectional view taken on the line XX—XX in FIG. 18.

As shown in FIGS. 18 through 20 of the drawings, the non-volatile semiconductor memory of the present invention is arranged so as to have floating gate electrodes 4a, which are formed on the insulating film which is formed over the semiconductor substrate 1, control gate electrodes 4b, which is formed on an insulating film 3', which is formed on the floating gate electrodes 4a respectively, and a wiring layer 11a, which is formed on, for example, the barrier metal layer 10 so as to be directly connected to the surfaces of the control gate electrodes 4b. Moreover, the control gate electrodes 4b are patterned in the same manner as the floating gate electrodes 4a. Further, the adjacent control gate electrodes 4b are separated by the interlayer insulating film 6, and the height of the surface of the interlayer insulating film 6 is equal with the height of the surfaces of the control gate electrodes 4b. Moreover, in the present embodiment, the electrically conductive layer 9 is formed on, for example, the barrier metal layer 8 so as to be connected to the diffusion layers 5 of the semiconductor substrate 1, thereby composing the buried electrodes 12. Moreover, the wiring layer 11b is formed on, for example, the barrier metal layer 10 so as to be directly connected to the surfaces of the buried electrodes 12.

As mentioned above, the non-volatile semiconductor memory according to the present embodiment is characterized in that the height of the surface of the interlayer insulating film 6, which separates the control gate electrodes 4b, is equal with the height of the surfaces of the control gate electrodes 4b, and the wiring layer 11a is formed on the control gate electrodes 4b so as to be directly connected to the surfaces of the control gate electrodes 4b.

As mentioned above, in the present embodiment, compared with the conventional case that the interlayer insulating film is formed on the control gate electrodes 4b and the wiring layer is formed by making the connecting holes, the connection resistance can be reduced because the wiring layer 11a is connected to the control gate electrodes 4b without via the connecting holes.

In addition, since the wiring layer is directly on the control gate electrodes 4b, unevenness can be reduced more than the case where the interlayer insulating film is formed on the control gate electrodes 4b and the wiring layer is formed thereon. In particular, in the non-volatile semiconductor memory according to the present embodiment, the floating gate electrodes 4a and the control gate electrodes 4b form a layered structure in the memory cell region, and thus unevenness is large. For this reason, if the interlayer insulating film is formed thereon, the unevenness becomes larger. Therefore, in the present embodiment, the unevenness can be greatly reduced compared with the above case.

In addition, since it is not necessary to open the connecting holes on the control gate electrodes 4b by patterning, an aligning margin for patterning of the control gate electrode 4b and the connecting holes, is not required. For this reason, the non-volatile semiconductor memory can be highly integrated.

In addition, in the present embodiment, when the height of the surfaces of the buried electrodes 12 to be connected to the diffusion layers 5 is made equal with the control gate electrodes 4b, the wiring layer 11 can be easily formed similarly to the first through third embodiments.

In particular, in the non-volatile semiconductor memory according to the present embodiment, since the gate electrode has a layered structure, the unevenness due to the gate electrode is remarkable, and thus it is possibly difficult to form the wiring layer in the connecting hole so as to be directly connected to the diffusion layer 5. For this reason, in the present embodiment, when the buried electrodes 12 are formed and the height of their surfaces are made substantially equal with the control gate electrodes 4b, it is possible to reduce the connection resistance between the diffusion layers 5 and the wiring layer 11b.

The above non-volatile semiconductor memory can be formed by replacing the gate electrodes 4 in the producing method according to the first through third embodiments with the floating gate electrodes 4a and the control gate electrodes 4b, which are layered on the insulating film 3'. However, the floating gate electrodes 4a and the control gate electrodes 4b can be formed by forming a first electrically conductive film on the insulating film 3, which is formed on the semiconductor substrate 1, layering a second electrically conductive film on the insulating film 3' which is formed on the first electrically conductive film, and etching the first and second electrically conductive films and the insulating film 3' by the normal lithography method and etching technique, for example.

In the conventional manner, since after the first electrically conductive film to be the floating gate electrode 4a was patterned, the insulating film 3' was formed, and the second electrically conductive film to be the control gate electrode was formed on the insulating film 3' so that the second electrically conductive film is patterned, it was necessary to pattern the control gate electrodes 4b with the unevenness due to the floating gate electrodes 4a existing. For this reason, there arise a problem that the processing of the control gate electrode is difficult. On the contrary, in the present embodiment, since the first electrically conductive film and the second electrically conductive film are patterned simultaneously, the unevenness at the time of patterning can be reduced. As a result, it is possible to solve the problem that the processing is difficult in the lithography technique or the etching technique.

In the above first through fourth embodiments, the gate electrodes 4 of the MOS transistor or the floating gate electrodes 4a or the control gate electrodes 4b of the non-volatile semiconductor memory can be made of, for example, a polycrystal silicon film, a silicide film of MoSi, WSi, etc., or a salicide film of Ti, for example, formed on a polycrystal silicon film.

In addition, as mentioned above, it is desirable that the CMP method is used for the etching step of exposing the surfaces of the gate electrodes 4 or the control gate electrodes 4b, however even when another method is used as long as such a method can execute the etching so that the height of the surfaces of the gate electrodes 4 or the control gate electrodes 4b is equal with the height of the surface of the interlayer insulating film, and theses surfaces form a plane, the same effect as the present invention can be obtained.

Further, the fourth embodiment refers to the case where the present invention is applied to the non-volatile semiconductor memory, for example, however the present invention is not limited to this and is applied to another semiconductor memory such as DRAM and a high density semiconductor device, thereby obtaining the same effect as the fourth embodiment.

In addition, in the aforementioned embodiment, as the interlayer insulating film 6, an insulating film which is used for a normal interlayer insulating film, such as an oxide film of SiO2 or an oxide film containing impurities such as PSG (oxide film containing phosphorus), BSG (oxide film containing boron), AsSG (oxide film containing arsenic), and BPSG (oxide film containing boron and phosphorus), or a TEOS (tetraethoxysilane) film, can be used.

As mentioned above, in accordance with the semiconductor device and the producing method thereof of the present invention, a highly-integrated semiconductor device, which can reduce the resistance between the gate electrodes and the wiring layer over the gate electrodes and can make an element minute, can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor device comprising:

a control gate electrode formed on a semiconductor substrate;

a source/drain diffusion layer formed on a surface region of the semiconductor substrate;

a buried electrode of tungsten, formed on the diffusion layer;

a barrier metal surrounding the buried electrode;

an interlayer insulating film buried in a space between the gate electrode and the buried electrode, a height of surface of the interlayer insulating film, a height of surface of the gate electrode and a height of surface of the buried electrode being equal, and the surfaces of the interlayer insulating film, the gate electrode and the buried electrode forming a plane;

barrier metals formed on the surface of the gate electrode and the buried electrode;

wiring layers formed on the barrier metals formed on the surfaces of the gate electrode and the buried electrode.

2. A semiconductor device comprising:

a stacked gate electrode formed on a semiconductor substrate;

a source/drain diffusion layer formed on a surface region of the semiconductor substrate;

a buried electrode of tungsten, formed on the diffusion layer;

a barrier metal surrounding the buried electrode;

an interlayer insulating film buried in a space between the gate electrode and the buried electrode, a height of surface of the interlayer insulating film, a height of surface of the gate electrode and a height of surface of the buried electrode being equal, and the surfaces of the interlayer insulating film, the gate electrode and the buried electrode forming a plane;

barrier metals formed on the surface of the gate electrode and the buried electrode;

wiring layers formed on the barrier metals formed on the surfaces of the gate electrode and the buried electrode.

* * * * *